(12) United States Patent
Yang et al.

(10) Patent No.: US 12,317,584 B2
(45) Date of Patent: May 27, 2025

(54) METHOD OF FORMING HIGH VOLTAGE TRANSISTOR AND STRUCTURE RESULTING THEREFROM

(71) Applicant: TAIWAN SEMICONDUCTOR MANUFACTURING COMPANY LTD., Hsinchu (TW)

(72) Inventors: Yuan-Cheng Yang, Tainan (TW); Yun-Chi Wu, Tainan (TW); Tsu-Hsiu Perng, Hsinchu County (TW); Shih-Jung Tu, Tainan (TW); Cheng-Bo Shu, Tainan (TW); Chia-Chen Chang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 423 days.

(21) Appl. No.: 17/824,942

(22) Filed: May 26, 2022

(65) Prior Publication Data

US 2023/0387107 A1  Nov. 30, 2023

(51) Int. Cl.
*H01L 21/265* (2006.01)
*H10D 84/01* (2025.01)
*H10D 84/03* (2025.01)
*H10D 84/83* (2025.01)

(52) U.S. Cl.
CPC ......... *H10D 84/83* (2025.01); *H10D 84/0128* (2025.01); *H10D 84/013* (2025.01); *H10D 84/0142* (2025.01); *H10D 84/0151* (2025.01); *H10D 84/0156* (2025.01); *H10D 84/038* (2025.01); *H01L 21/26533* (2013.01)

(58) Field of Classification Search
CPC .... H10D 84/83; H10D 84/835; H10D 84/151; H10D 30/026; H10D 64/017; H01L 21/265
See application file for complete search history.

(56) References Cited

U.S. PATENT DOCUMENTS 5,998,277 A * 12/1999 Wu .................... H01L 21/76229
                                                          438/440
2021/0351293 A1* 11/2021 Gu ........................ H10D 30/603

OTHER PUBLICATIONS

H.-S. Philip Wong et al., "A New Test Structure for Shallow Trench Isolation STI Depth Monitor", 2007 IEEE International Conference on Microelectronic Test Structures, Mar. 19-22, pp. 29-31, Tokyo, Japan.
Ran Ye et al., "Anomalous output characteristics shrinkage in STI-LDMOS", Superlattices and Microstructures, vol. 128, pp. 204-211, 2019.

* cited by examiner

*Primary Examiner* — Suberr L Chi
(74) *Attorney, Agent, or Firm* — WPAT LAW; Anthony King

(57) ABSTRACT

A method includes: etching a trench on a surface of a substrate; filling the trench with a dielectric material to form a first isolation region; depositing a patterned mask layer on the substrate, the patterned mask layer comprising an opening exposing the substrate; implanting oxygen into the substrate through the opening to form an implant region; generating a second isolation region from the implant region; and forming a transistor on the substrate. The transistor includes a channel laterally surrounding the second isolation region.

20 Claims, 16 Drawing Sheets

METHOD OF FORMING HIGH VOLTAGE TRANSISTOR AND STRUCTURE RESULTING THEREFROM

BACKGROUND

High-voltage transistors are widely used in modern semiconductor devices, e.g., power management integrated circuits (PMIC). The high-voltage transistors are generally designed to be operated at a greater voltage, e.g., voltage greater than 10 volts, 20 volts or 30 volts. Therefore, a high breakdown voltage is required for a high-voltage transistor, which may be manufactured under a design specification different than that of a medium-voltage or low-voltage transistor in the same circuit. As such, there is a need to improve the manufacturing process of the high-voltage transistor to enhance the breakdown voltage while maintaining manufacturing compatibility with the medium-voltage or low-voltage transistors formed using the existing manufacturing processes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
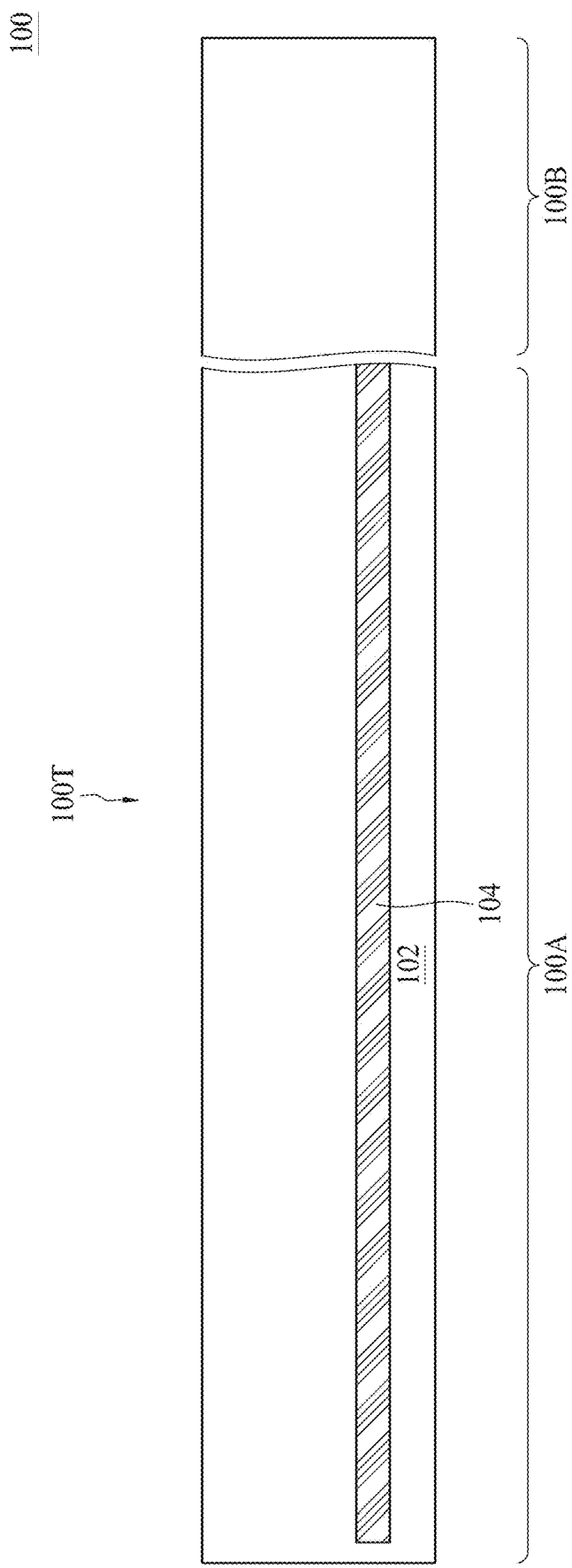
FIGS. 1A to 1P are cross-sectional views of intermediate stages of a method of forming a semiconductor device, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Embodiments of the present disclosure discuss a method of forming high-voltage (HV) transistors and a semiconductor structure resulting therefrom. The HV transistors are generally operated under a relatively high voltage, e.g., about 30 volts or higher. Among the various HV transistor configurations, laterally diffused metal-oxide semiconductor (LDMOS) transistors provide the advantages of low turn-on resistance and high breakdown voltage. However, as the voltage operation range is continually increased for the HV transistors in modern applications, the breakdown voltage of the HV transistor should also be increased accordingly for withstanding the high operation voltage. Since the existing LDMOS transistor is formed in which a uniform formation process is applied for all isolation regions of the LDMOS transistor and the isolation regions for other medium-voltage (MV) and low-voltage (LV) transistors. As a result, the isolation region designed for withstanding the high voltage may fail the design requirement despite that other isolation regions design for MV or LV transistors can still function normally.

To address the above issues, the present disclosure proposes a forming method of a semiconductor structure including the HV transistor and non-HV (NHV) transistor, where the various isolation regions subjected to different working voltages are formed with different methods and structures. As a result, the performance of the HV transistors can be improved due to the enhanced voltage-withstanding capability of the isolation region in the HV transistor while the manufacturing compatibility with the NHV transistors can be maintained. Therefore, the overall semiconductor production cost and time can be enhanced.

Figure 1B:
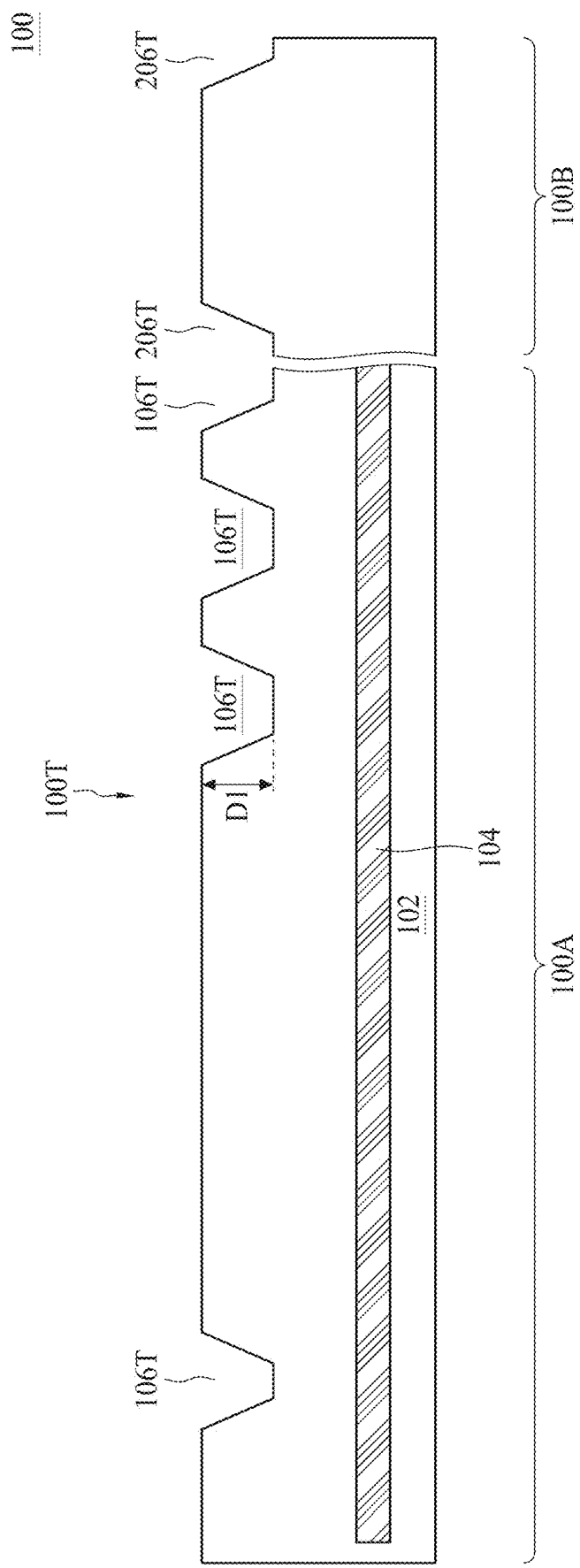
Figure 1C:
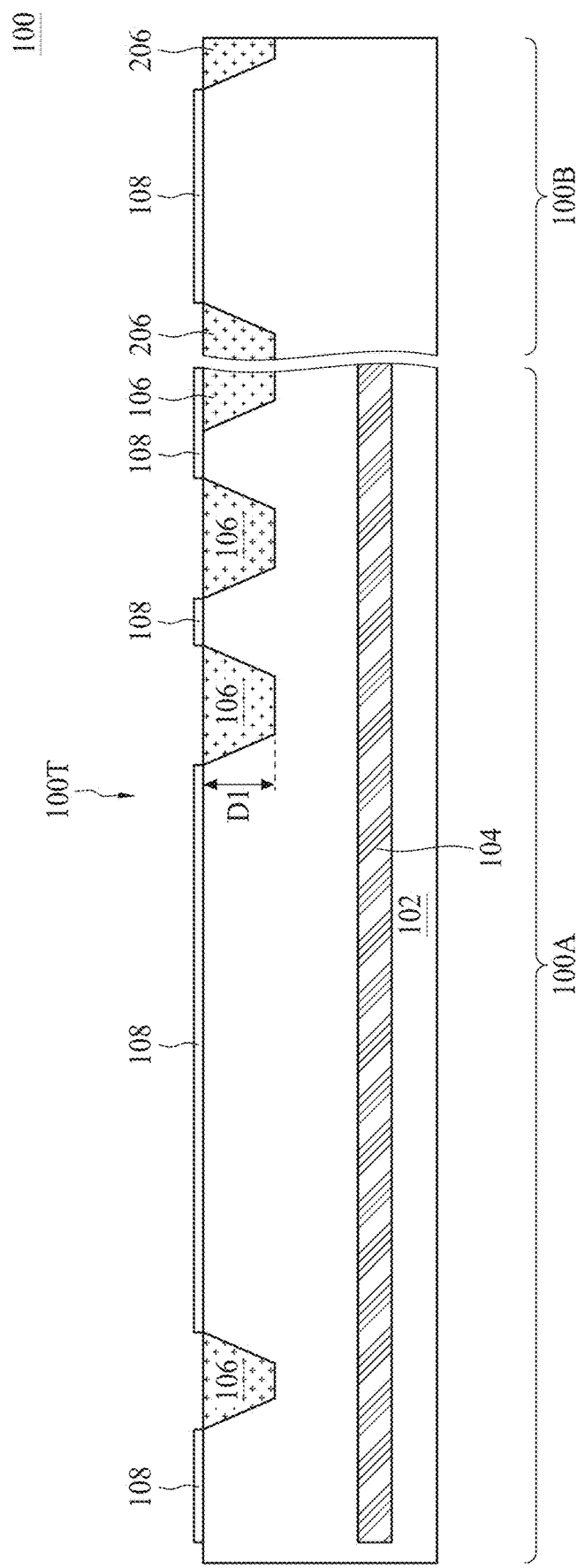
Figure 1D:
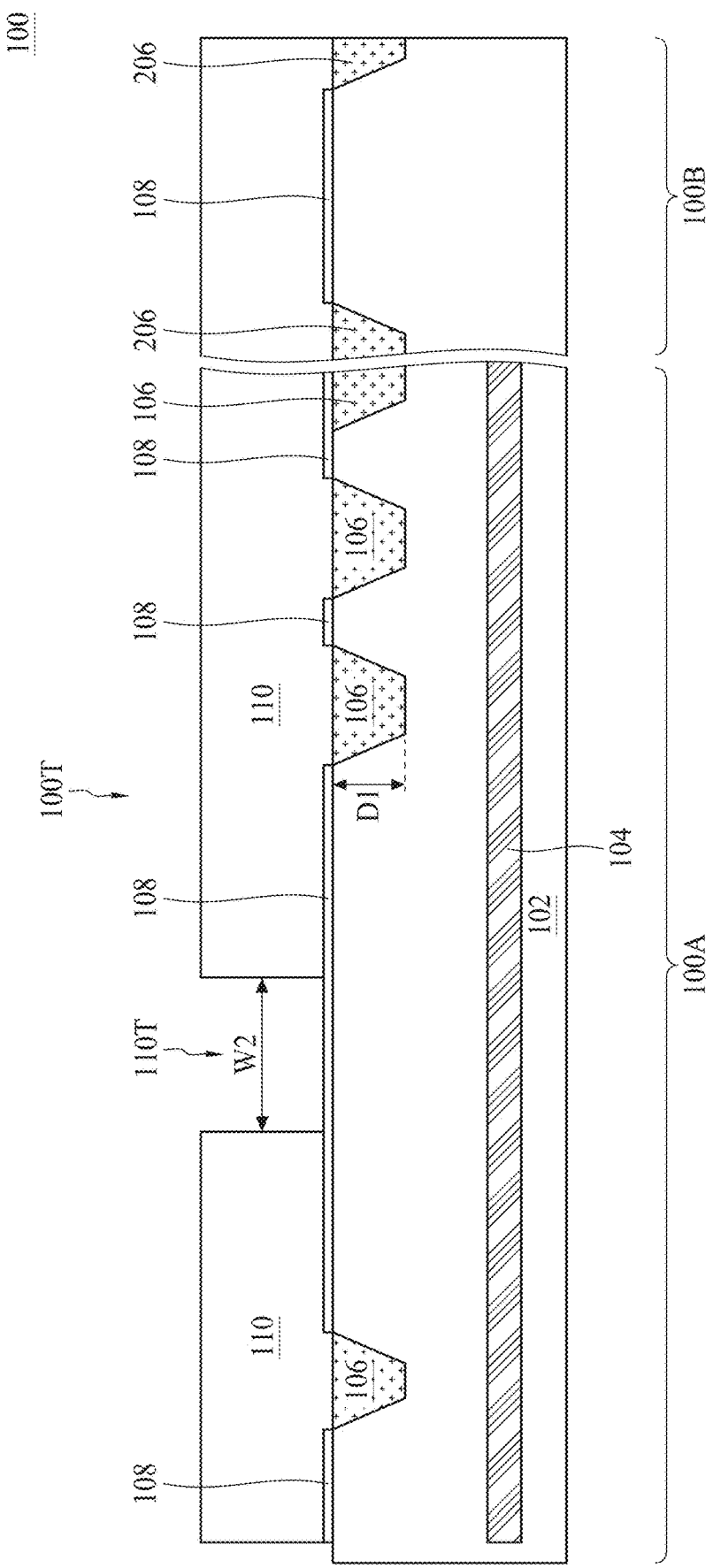
Figure 1E:
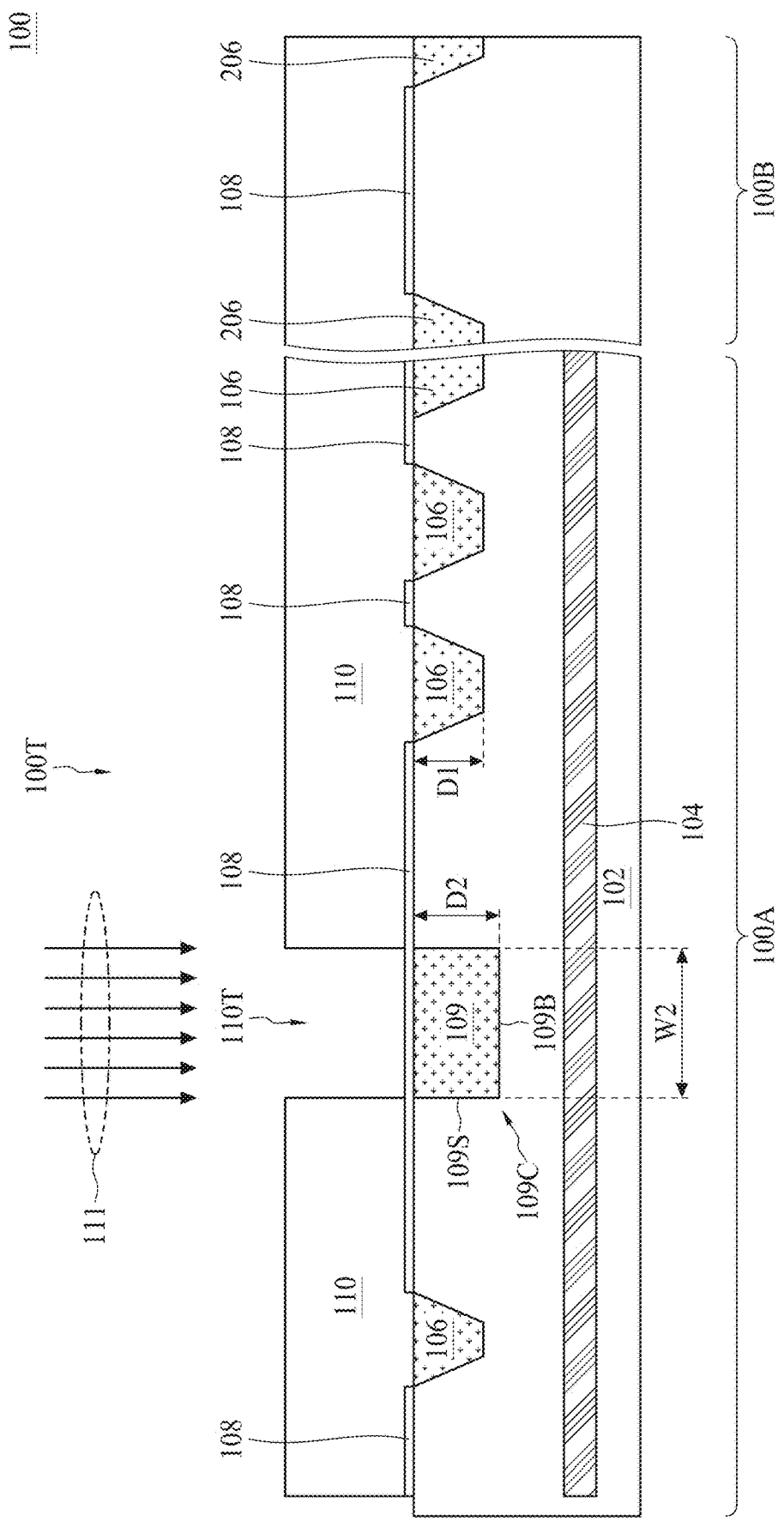
Figure 1F:
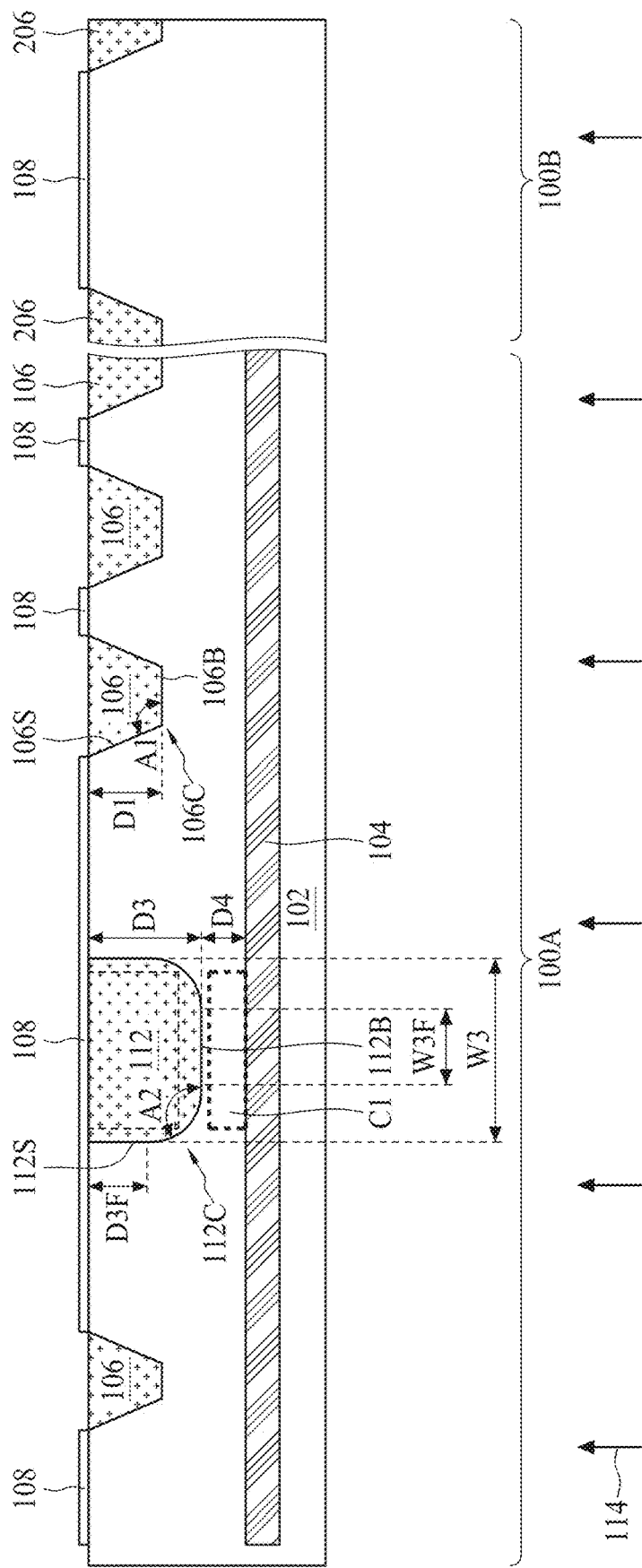
Figure 1G:
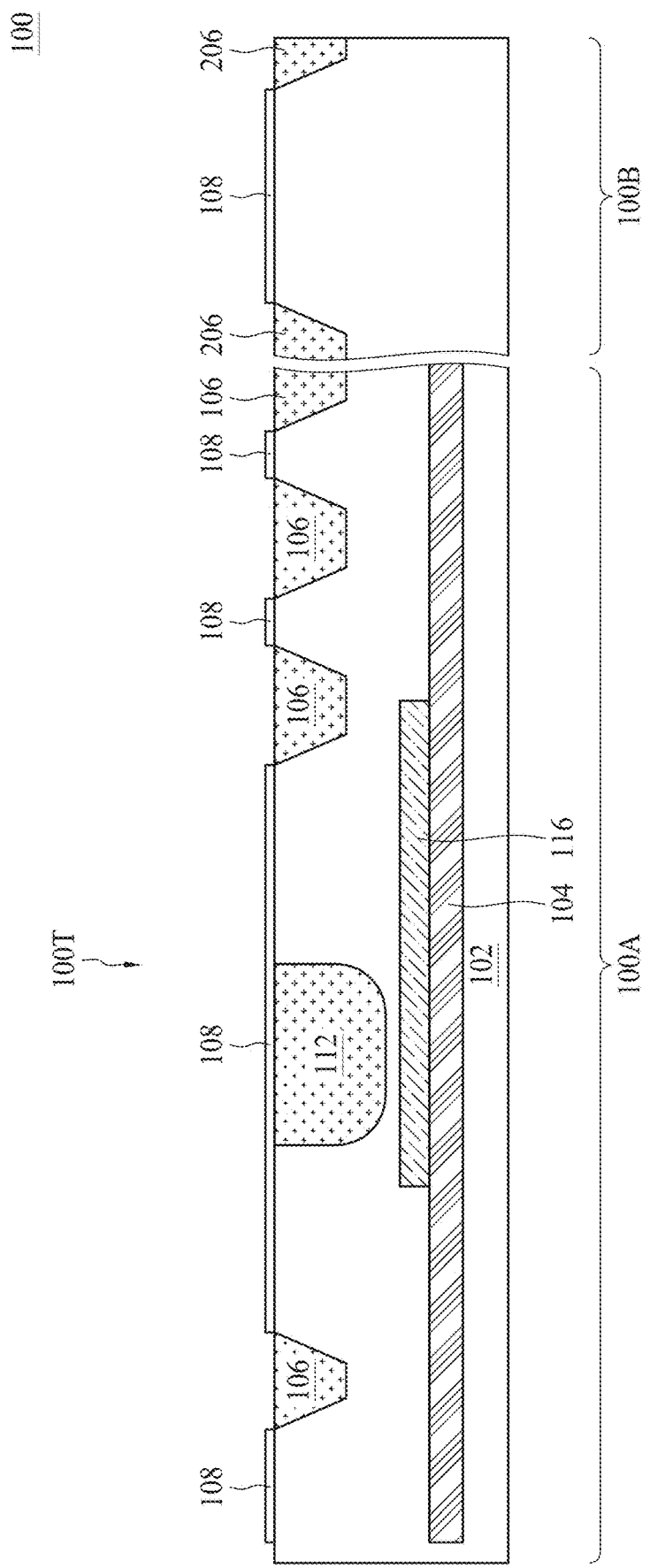
Figure 1H:
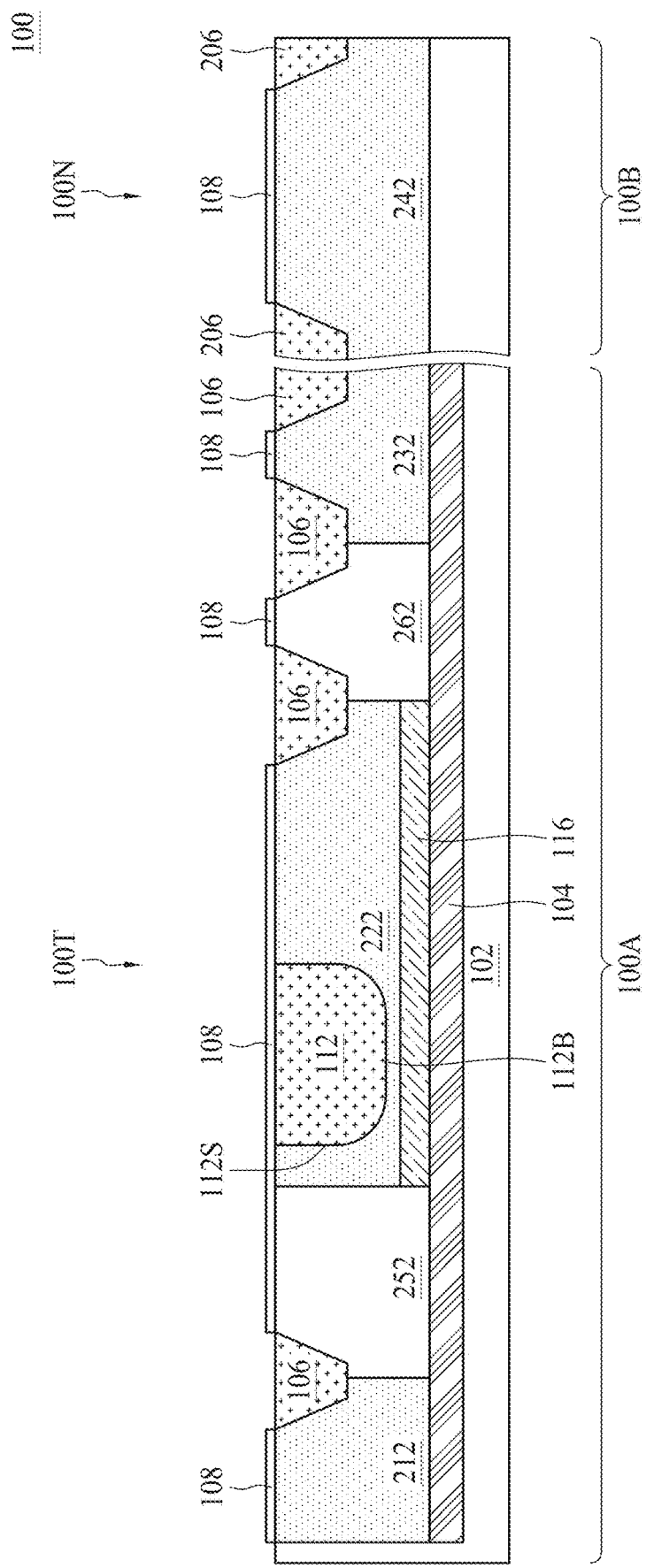
Figure 1I:
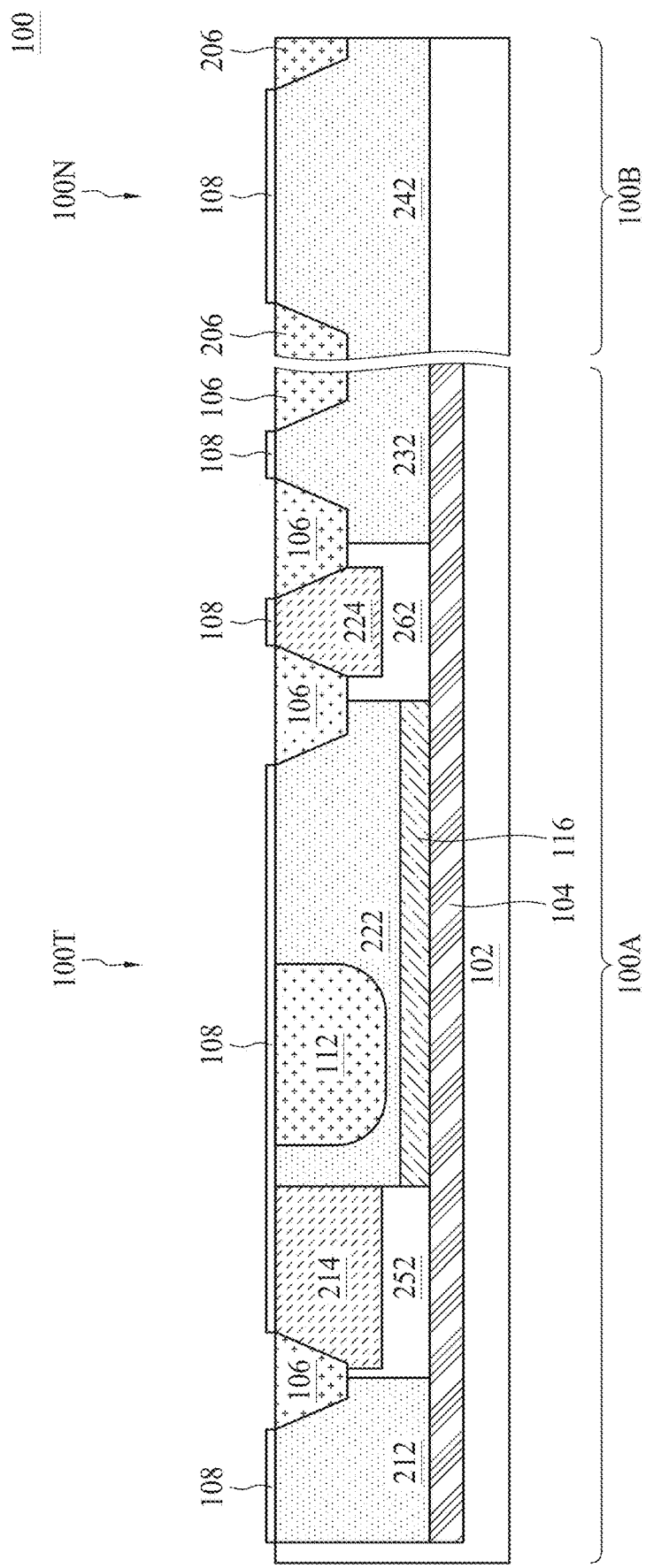
Figure 1J:
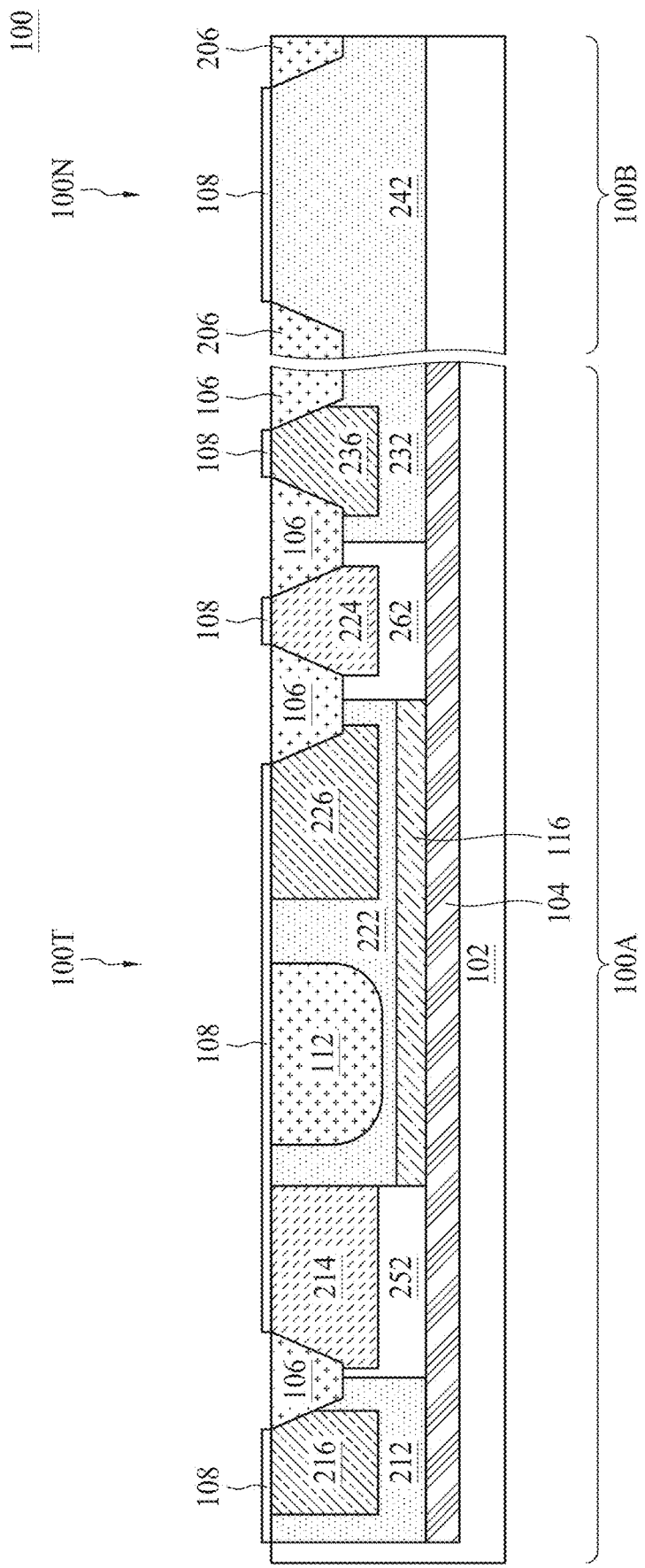
Figure 1K:
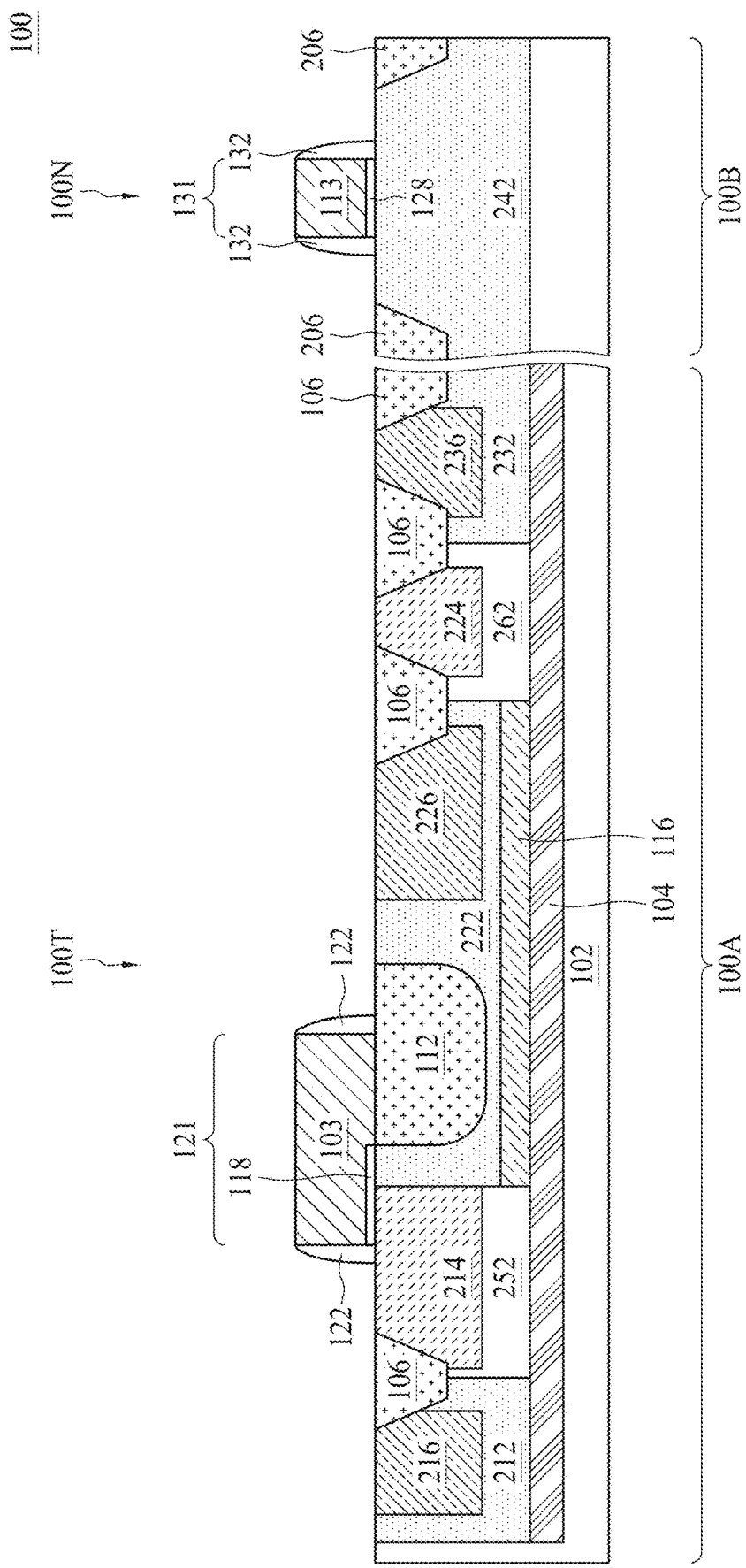
Figure 1L:
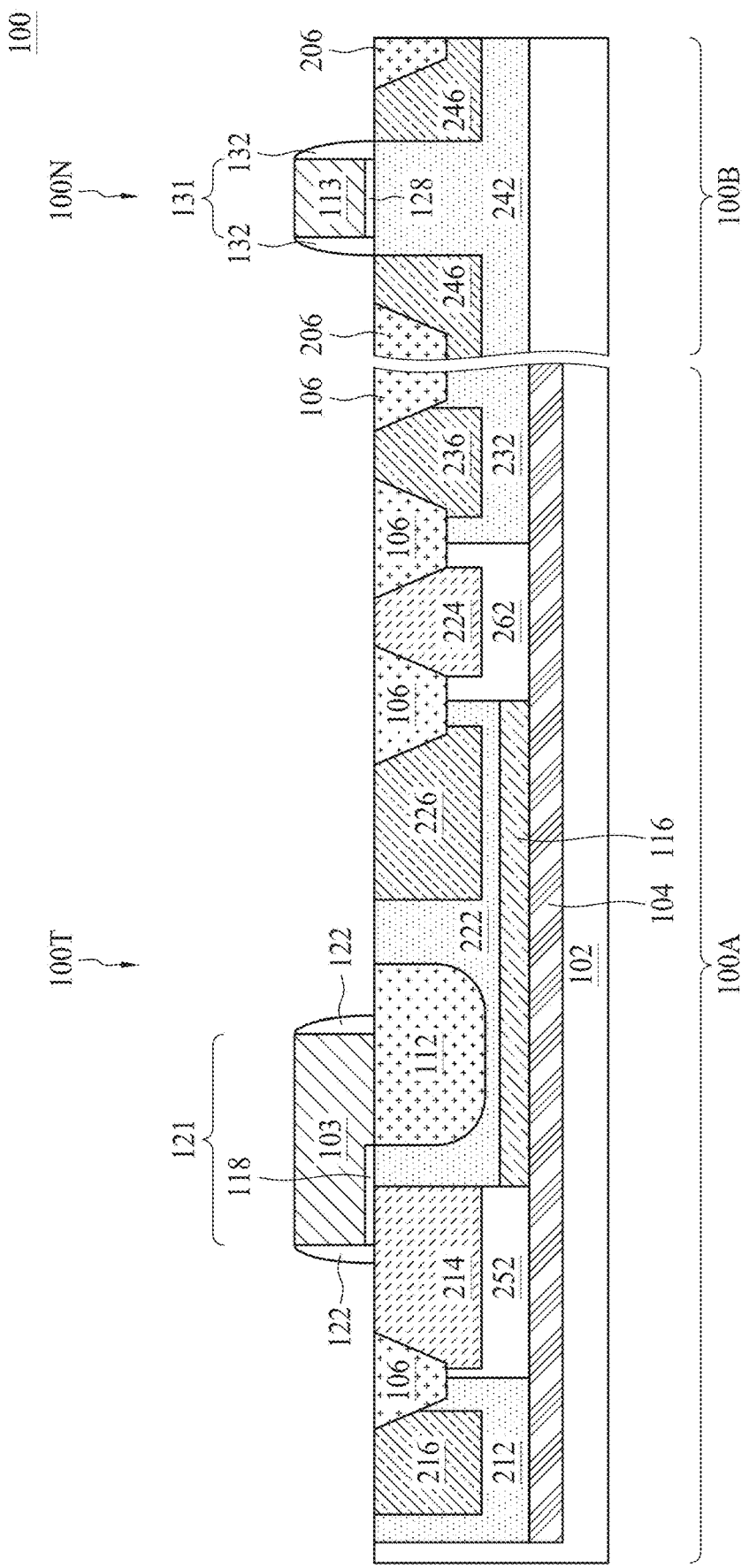
Figure 1M:
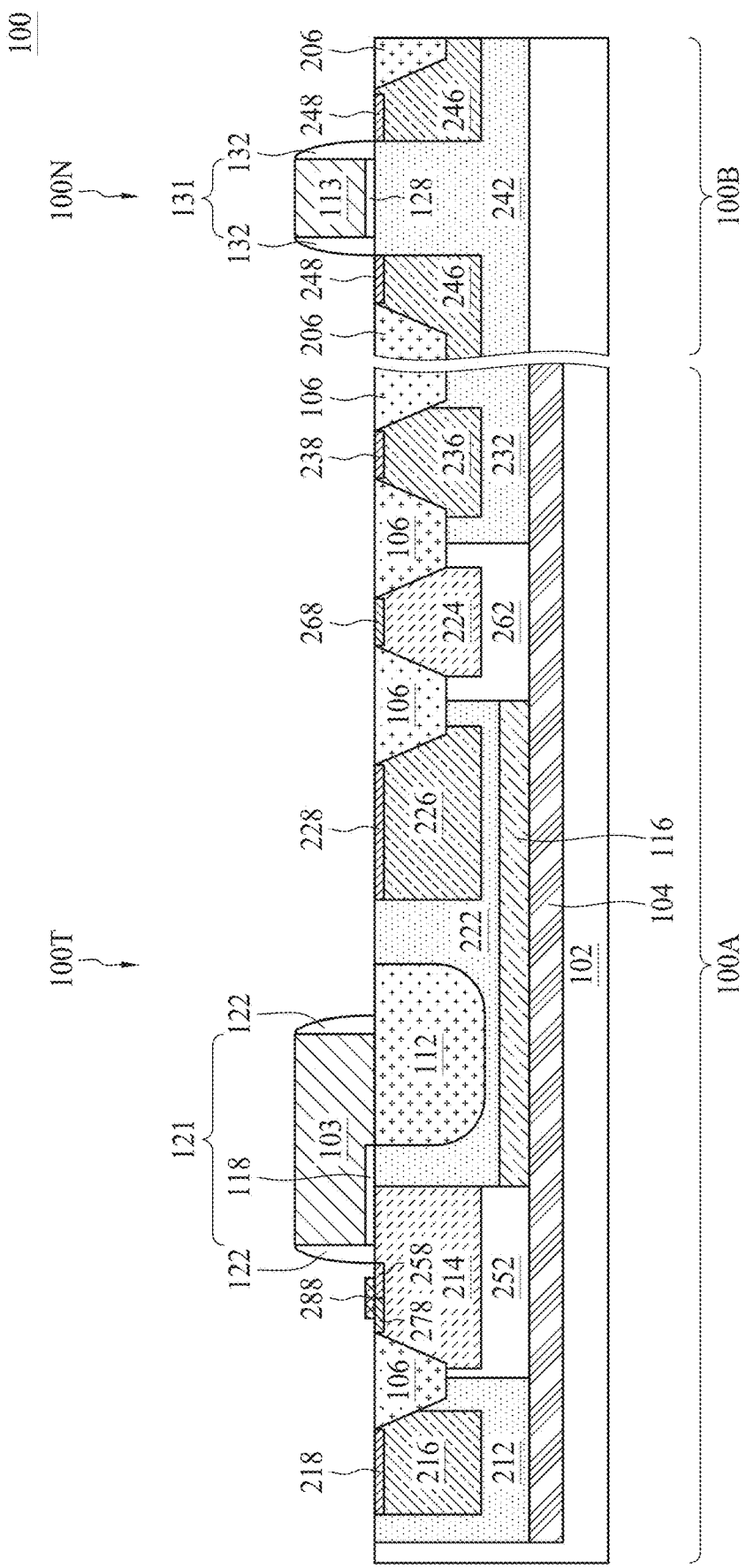
Figure 1N:
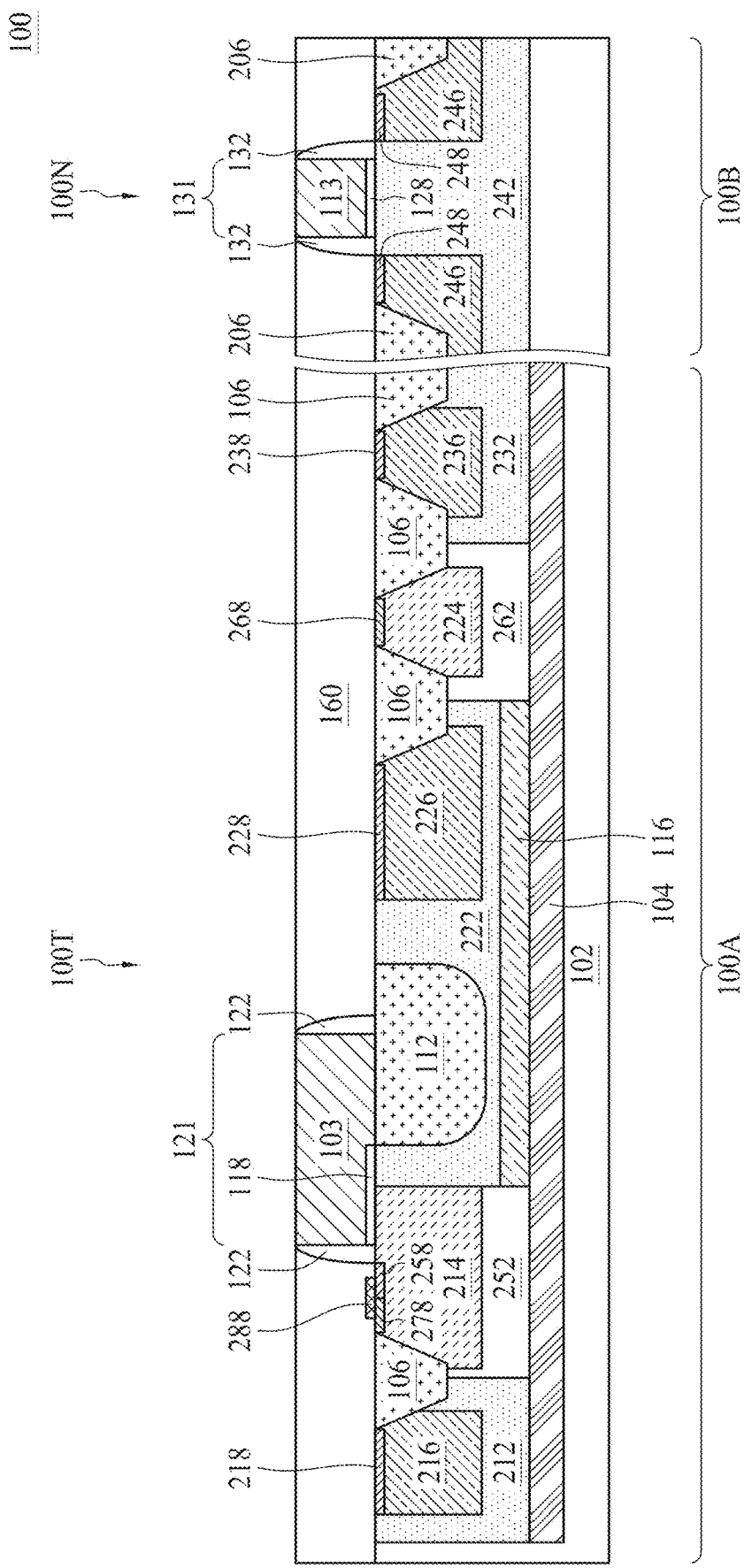
Figure 10:
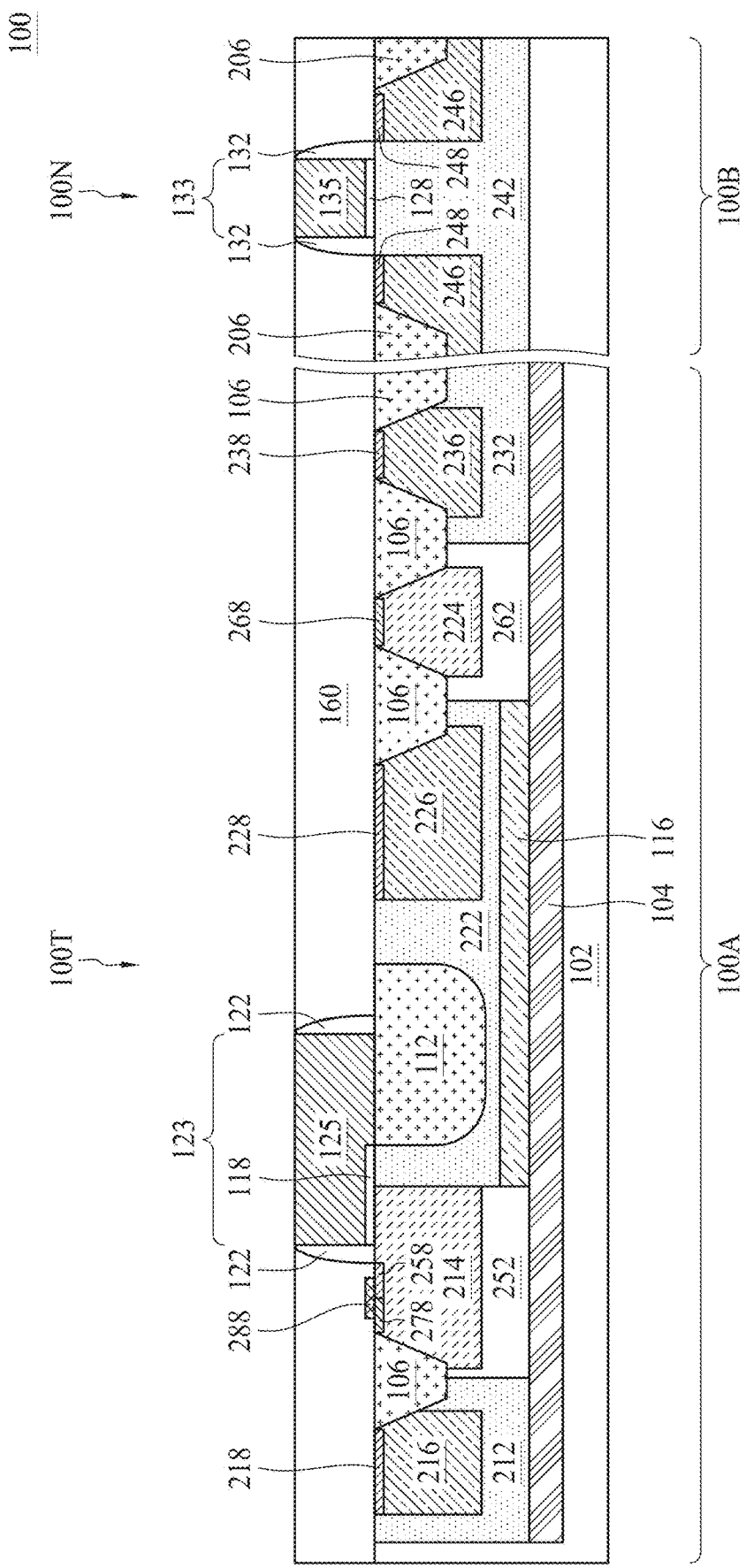
Figure 1P:
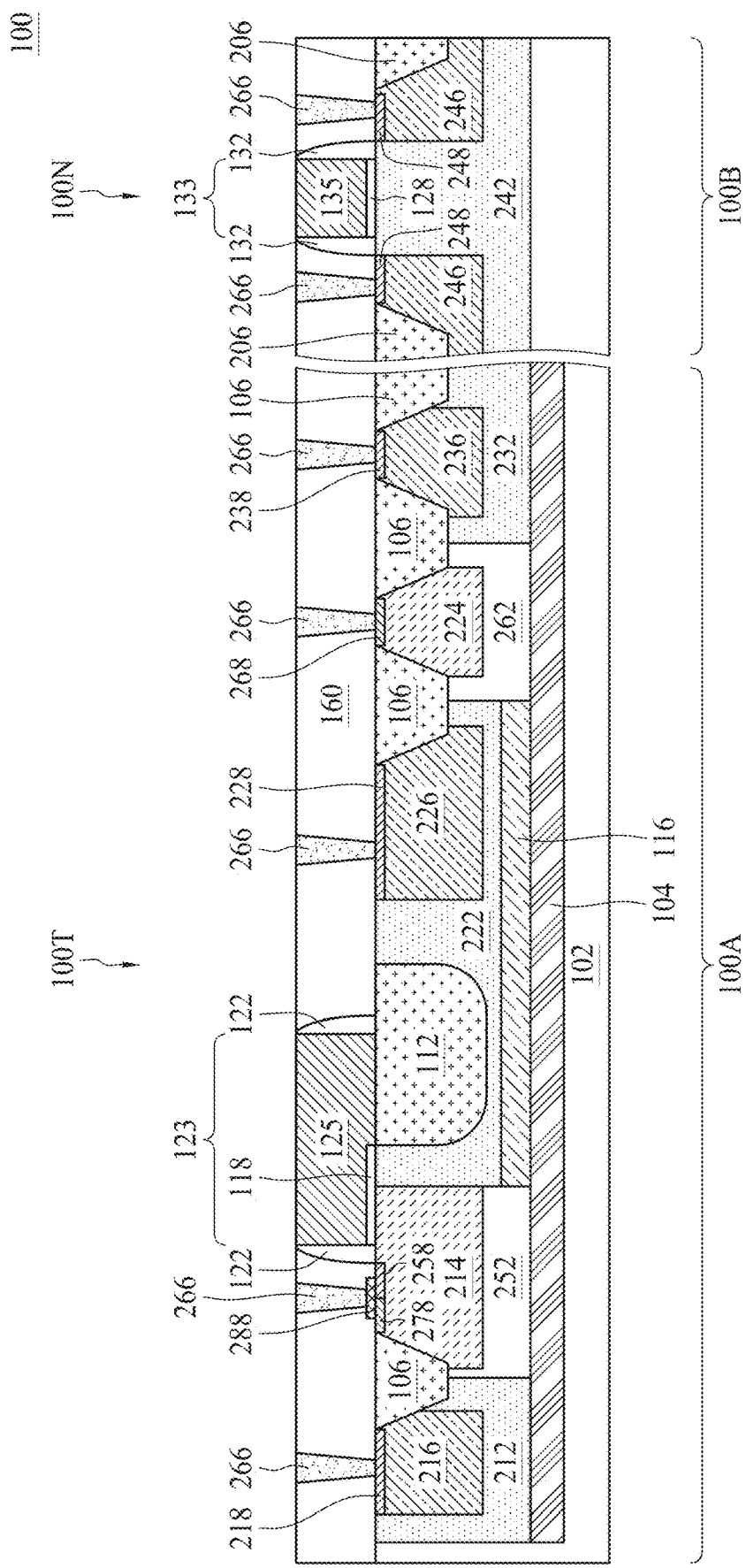

FIGS. 1A to 1P are cross-sectional views of intermediate stages of a method of forming a semiconductor device 100, in accordance with some embodiments of the present disclosure. In some embodiments, the semiconductor device 100 includes at least two zones 100A and 100B for forming transistors of different operation voltages. The transistors of the semiconductor device 100 may include metal-oxide semiconductor (MOS) field-effect transistors (FET). In some embodiments, the zone 100A is referred to herein as a HV zone, and includes HV transistors, e.g., an example HV transistor 100T. In some embodiments, the zone 100B is referred to herein as a NHV zone, e.g., one or more of the MV zone or LV zone, and includes MV transistors or LV transistors, e.g., an example NHV transistor 100N (shown in FIG. 1H). Throughout the present disclosure, the term "HV transistor" refers to a transistor, e.g., an LDMOS transistor, that operates in a relatively high voltage range, e.g., the voltage may be greater than 5 volts, 10 volts, 20 volts, 30 volts or higher, and terms "NHV transistor" refers to an MV or LV transistor that operates in a medium or low operation voltage range, e.g., the operation voltage may be lower than 5 volts. In some embodiments, the operation voltage ranges for the various types of transistors, e.g., the HV transistor, the MV transistor, and the LV transistor, are varying based on different applications. In some embodiments, the operation voltage of the HV transistor is no less than that of the NHV transistor, and the operation voltage of the MV transistor is no less than that of the LV transistor. The category of the three types of transistors as discussed above is shown for illustration purposes. The semiconductor device 100 can include more than two zones for accommodating more than two types of transistors of the respective operation voltage ranges.

Referring to FIG. 1A, a substrate 102 is provided or formed. In some embodiments, the substrates 102 includes semiconductor material such as bulk silicon. In some embodiments, the substrate 102 includes other semiconductor materials, such as silicon germanium, silicon carbide, gallium arsenide, or the like. In some embodiments, the substrate 102 is a p-type semiconductive substrate (acceptor type) or an n-type semiconductive substrate (donor type). Alternatively, the substrate 102 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the substrate 102 includes portions to form a semiconductor-on-insulator (SOI) substrate. In other alternatives, the substrate 102 may include a doped epitaxial layer, a gradient semiconductor layer, and/or a semiconductor layer overlaying another semiconductor layer of a different type, such as a silicon layer on a silicon germanium layer.

A barrier layer 104 is formed in the substrate 102. The barrier layer 104 is formed in a lower portion at a depth of the substrate 102, wherein barrier layer and the higher portion of the substrate 102 over the barrier layer 104 are spared for the HV transistor 100T. The barrier layer 104 is also referred to as a buried layer. Furthermore, the barrier layer 104 is configured as an isolation layer such that noise resulting from different circuits disposed in other areas (not shown) may be shielded by the barrier layer 104. Thus, the electrical performance of the HV transistor 100T may be maintained. In an embodiment, the barrier layer 104 is doped with a different conductivity type than the semiconductor substrate 102. For example, the barrier layer 104 is doped with an N-type dopant in a P-type semiconductor substrate 102. In some embodiments, the barrier layer 104 is present only in the HV zone 100A for the HV transistors. In some embodiments, the NHV zone 100B that not used for the HV transistors are free of any of barrier layers.

In some embodiments, the barrier layer 104 is formed by an ion implantation operation. The implantation dose and power are dependent upon the predetermined thickness and depth of the barrier layer 104. In some embodiments, a patterned mask layer (not separately shown) is formed over the substrate 102 to expose the HV zone 100A while covering the other zones, e.g., NHV zone 100B. The dopants, e.g., an N-type dopant such as arsenic, phosphorus, or the like, are implanted into substrate 102 in the region of the HV zone 100A. In some embodiments, after the ion implantation operation is completed, the pattern mask layer is stripped or removed.

Referring to FIG. 1B, a plurality of trenches 106T are etched in the substrate 102. The trenches 106T are formed on the upper surface of the substrate 102 in the HV zone 100A. The trenches 106T may have substantially equal depths D1 measured from the upper surface of the substrate 102. In some embodiments, the depth D1 is in a range between about 0.1 μm and about 0.5 μm, e.g., 0.3 μm. The trenches 106T may be formed using a dry etch, a wet etch, a reactive ion etch (RIE), a combination thereof, of the like. In embodiments where the trenches 106T are formed by a dry etch, each of the trenches 106T has substantially straight and slanted sidewalls and a substantially flat bottom surface.

In some embodiments, a plurality of trenches 206T are also etched on the substrate 102. The trenches 206T are formed on the upper surface of the substrate 102 in the NHV zone 100B. The trenches 206T may be formed using a dry etch, a wet etch, an RIE, a combination thereof, of the like. The trenches 206T may have substantially equal depths D1 measured from the upper surface of the substrate 102, and may have depths D1 equal to those of the trenches 106T. In some embodiments, each of the trenches 206T has substantially straight and slanted sidewalls and a substantially flat bottom surface. In some embodiments, the trenches 106T and 206T are formed by a same etching operation; alternatively, the trench 106T and the trench 206T are formed in separate etching operations.

Referring to FIG. 1C, a plurality of isolation regions 106 are formed in the trenches 106T. The isolation regions 106 may include electrically insulating materials or dielectric materials, such as silicon oxide; however, other dielectric materials, e.g., silicon nitride, silicon oxynitride, silicon carbide, or the like, are also possible for forming the isolation regions 106. In some embodiments, the isolation regions 106 are formed using chemical vapor deposition (CVD), physical vapor deposition (PVD), atomic layer deposition (ALD), oxidation, nitridation, spin-on coating, or other suitable deposition methods. In some embodiments, the isolation regions 106 are referred to as shallow trench isolation (STI) regions.

After the dielectric material of the isolation region 106 fills the trench 106T, a planarization operation, e.g., chemical mechanical polishing (CMP), may be adopted to remove excess dielectric materials over the upper surface of the substrate 102 and level the surface of the isolation regions 106 with the upper surface of the substrate 102.

In some embodiments, a plurality of isolation regions 206 are formed in the trenches 206T. The isolation regions 206 may include electrically insulating materials or dielectric materials, such as silicon oxide; however, other dielectric materials, e.g., silicon nitride, silicon oxynitride, silicon carbide, or the like, are also possible for forming the isolation regions 206. The isolation regions 206 may have a material the same as or different from the isolation region 106. In some embodiments, the isolation regions 206 are formed using CVD, PVD, ALD, oxidation, nitridation, spin-on coating, or other suitable deposition methods. After the dielectric material of the isolation region 206 fills the trench 206T, a planarization operation, e.g., CMP, may be adopted to remove excess dielectric materials over the upper surface of the substrate 102 and level the surface of the isolation regions 206 with the upper surface of the substrate 102. In some embodiments, the isolation regions 206 are formed together with the forming of the isolation regions 106. In some embodiments, the isolation regions 206 are referred to as STI regions.

As discussed previously, in some embodiments, the electrically insulating material, e.g., silicon dioxide, of the isolation regions 106, 206 are formed by deposition, e.g., reacting silicon-based precursor with oxygen in a deposition chamber to generate a film of silicon oxide on the sidewalls and bottom of the trench 106T or 206T. The silicon atoms of the substrate 102 around the trenches 106T or 206T are substantially not involved in the formation of the isolation region 106 or 206.

In some embodiments, the isolation regions 106, 206 are formed in the NHV zone 100B and at the boundary of the HV zone 100A and the NHV zone 100B, and are used to define the boundary of the zones 100A, 100B or the boundary of each transistor in the respective zones 100A, 100B. The isolation regions 106, 206 are also configured to electrically isolate adjacent transistors.

Referring to FIG. 1C, a sacrificial layer 108 is formed on the upper surface of the substrate 102 across the zones 100A and 100B. The sacrificial layer 108 may be formed of a dielectric material, such as silicon oxide, silicon nitride, silicon oxynitride, or other suitable materials. In the present embodiment, the sacrificial layer 108 is formed of silicon oxide. The sacrificial layer 108 can serve as a protective layer to protect the surface of the substrate 108 from being damaged in subsequent operations, and can be removed subsequent to these operations. In some embodiments, the sacrificial layer 108 is formed on the surface of the substrate 102 in the area other than the isolation regions 106, 206. As a result, the isolation regions 106, 206 are exposed through the sacrificial layer 108. In some embodiments, the sacrificial layer 108 is formed by CVD, PVD, ALD, thermal oxidation, or other suitable deposition methods.

Referring to FIG. 1D, a patterned mask layer 110 is formed over the substrate 102. In some embodiments, the patterned mask layer 110 covers the isolation regions 106, 206 and the sacrificial layer 108. The patterned mask layer 110 may be formed of photoresist materials, or other hard mark material, e.g., oxide or nitride. As an example process of forming the patterned mask layer 110, a photoresist or hard mark material is deposited over the substrate 102, e.g., using CVD, PVD, ALD, spin-on coating, or other suitable deposition methods. The photoresist or hard mask material is patterned to form an opening 110T in the HV zone 100A. The forming of the opening 110T may include lithography and etching operations. The etching operation may include a dry etch, a wet etch, an ion reactive etch (RIE), or a combination thereof. The opening 110T is used to define the area of an implant region 109 of the HV transistor 100T, in which the area has a width W2 from a cross-sectional view. In some embodiments, the width W2 is in a range between about 0.1 μm and about 10 μm, e.g., 3 μm. Through the forming of the opening 110T, a portion of the sacrificial layer 108 is exposed through the patterned mask layer 110.

Referring to FIG. 1E, an ion implantation operation 111 is performed to form an implant region 109 in the HV zone 100A. Through the ion implantation operation 111, oxygen ions are implanted into the depths of the substrate 102 through the opening 110T and the upper portions of the sacrificial layer 108. The oxygen ions are brought to contact and bond with the silicon atoms of the substrate 102 to convert the substrate 102 into silicon dioxide in the implant region 109. As such, the implant region 109 is also referred to herein an isolation region. The depth and profile of the implant region 109 are controlled by the recipes of the implantation operation 111. For example, the implantation operation 111 adopts an implant energy between about 100 KeV and about 300 KeV. The implantation operation 111 may use the process gas, such as oxygen, with an implant dose in a range between about $1\times10^{15}$ and about $1\times10^{18}$ atoms/cm$^2$. In some embodiments, the process gas further includes fluorine for expediting the formation of the silicon oxide through enhancing the bonding of oxygen ions with silicon in the substrate 102. The fluorine ions may not be left in the implant region 109 after the implantation operation 111. In some embodiments, the implant dose of the fluorine is in a range between about $1\times10^{15}$ and about $1\times10^{18}$ atoms/cm$^2$. A flow rate ratio of fluorine to oxygen may be in a range between about 5% and about 70%.

In some embodiments, the implantation operation 111 includes one or more implantations to control the profile and boundary of the implant region 109. For example, in order to obtain a desired height or depth D2 of the isolation region 112, the implantation operation 111 adopts with different implantation energies or implant doses to introduce the oxygen dopants to different depths of the substrate 102 in different shots of the implantations 111 to thereby achieve a uniformly distributed implant region 109. In some embodiments, the implant region 109 include a rectangular shape from a cross-sectional view. In some embodiments, the implant region 109 has substantially straight sidewalls 109S and a substantially flat bottom surface 109B. The implant region 109 may has a height or depth D2 In some embodiments, the depth D2 is greater than the depth D1 for providing higher voltage-withstanding capability during a HV operation condition. In some embodiments, the depth D2 is in a range between about 0.3 μm and about 4 μm, between about 0.5 μm and about 2.5 μm, e.g., 1.5 μm. In some embodiments, a depth ratio of D3 to D1 is between about 1.2 and about 20, or between about 1.5 and about 8. The implant region 109 may have bottom corners 109C formed by the sidewall 109S and the bottom surface 109B. In some embodiments, the bottom corner 109C is an angled corner. The bottom corner 109C has a right angle. The independently determined depths D2 for the implant region 109 can provide design flexibility for the HV transistor 100T and would not be limited to the uniform depth D1 of the isolation regions 106, 206 in the other regions.

FIG. 1F illustrates the removal of the patterned mask layer 110. In some embodiments, the patterned mask layer 110 is removed or stripped off using an etching operation. In some embodiments, the sacrificial layer 108 is retained and exposed after the removal of the patterned mask layer 110.

In some embodiments, a thermal operation 114 is performed on the substrate 102 after the isolation region 106 or 206 is formed. As a result, the thermal operation 114 may aid in densify the isolation regions 106, 206. In some embodiments, the thermal operation 114 activates the implanted oxygen ions and drives them to diffuse beyond the implant region 109 to thereby form an expanded isolation region 112. The thermal operation 114 may be performed using rapid thermal anneal (RTA), laser anneal, or other suitable annealing operations. In some embodiments, the thermal operation 114 is performed at a temperature between about 1000° C. and about 1200° C., e.g., between about 1050° C. and about 1100° C., for a period between about 30 seconds and about 30 minutes. In some embodiments, the CMP operation performed on the isolation regions 106, 206 is performed after the thermal operation 114. In some embodiments, since the isolation region 112 is formed by deposition, no excess material of the silicon oxide in the isolation region 112 extends over the surface of the substrate 102 or needs to be removed. In some embodiments, the isolation region 112 is referred to as an STI region.

In some embodiments, the isolation region 112 is formed as including fluorine-doped silicon oxide. In some embodiments, fluorine atoms are driven out of the isolation region 112 after the thermal operation 114, and therefore the doping concentration of fluorine is decreased in the isolation region 112. In some embodiments, the isolation region 112 is free of fluorine after the thermal operation 114.

As shown in FIG. 1F, the isolation region 112 has a width W3 and a depth (or height) D3. For the convenience of comparison, the boundary of the implant region 109 is marked in FIG. 1F by a dotted box within the isolation region 112. Since the isolation region 112 is expanded from the implant region 109, the sidewall 112S is moved outward laterally from the sidewall 109S, and the bottom surface 112B is moved downward from the bottom surface 109B.

In some embodiments, the bottom surface 112B of the isolation region 112 is spaced apart from the barrier layer 104 by a distance D4. The distance D4 may be in a range between about 0.05 μm and about 4 μm, e.g., 0.5 μm. The HV transistor may include a channel region C1 formed between the isolation region 112 and the barrier layer 104 such that carriers may drift between source/drain terminals through the channel region C1. The height of the channel region C1 may have impact on the channel resistance. Therefore, the dimensions of the depth D3 and the distance D4 should be appropriately determined to seek balance between the increased breakdown voltage and the reduced channel resistance.

In some embodiments, each of the isolation regions 106 or 206 has a bottom corner 106C at the bottom of the isolation region 106 or 206. The bottom corner 106C has a shape formed by the sidewall 106S and the bottom surface 106B. Referring to FIGS. 1B and 1E, since the shape of the bottom corner 106C is formed by etching the trench 106T through an etching operation, e.g., a dry etch, the sidewall 106S or the bottom surface 106B is substantially straight from a cross-sectional view. In some embodiments, the bottom corner 106C is an angled corner.

In contrast, the isolation region 112 has a bottom corner 112C at the bottom of the isolation region 112. The bottom corner 112 has a shape formed by the sidewall 112S and the bottom surface 112B. Referring to FIG. 1E, since the shape of the bottom corner 106C is determined by the implanted and then thermally diffused oxygen ions which react with silicon atoms of the substrate 102 to form a region of silicon oxide, the diffused oxygen ions lead to the rounded or curved contour of the sidewall 106S or the bottom surface 106B around the bottom corner 112C from a cross-sectional view. As a result, in some embodiments, the bottom corner 106C or 206C is sharper than the bottom corner 112C. In some embodiments, the bottom corner 112C is a rounded corner.

Since the bottom corner 112C is connected to the sidewall 112S and the bottom surface 112B, the sidewall 112S and the bottom surface 112B may not be entirely flat or straight. In some embodiments, the sidewall 112S has an upper portion proximal to the surface of the substrate 102 and a lower portion connected to the bottom corner 112C, in which the upper portion is substantially straight. The upper portion of the sidewall 112S has a height D3F less than the height D3. In some embodiments, a height radio between the upper portion (with height D3F) and the sidewall 112S (with height D3) is in a range between about 20% and about 80%. In some embodiments, the bottom surface 112B has a central portion and edge portions on two sides of the central portion, in which the central portion is substantially straight or flat. The central portion of the bottom surface 112B has a width W3F less than the width W3. In some embodiments, a width radio between the central portion (with width W3F) and the bottom surface 112B (with width W3) is in a range between about 20% and about 80%. In some embodiments, the lower portion of the sidewall 112S and the edge portions of the bottom surface 112B constitute the bottom corner 112C, in which the lower portion of the sidewall 112S and the edge portions of the bottom surface 112B are curved or rounded from a cross-sectional view.

The proposed isolation region 112 provides advantages. During HV operation of the HV transistors in the zone 100A, a great amount of charges tend to accumulate at the tip or angled corner of the isolation region 112 if the isolation region 112 is formed otherwise to include angle corners. Existing methods of forming the isolation region 112 may not provide a rounded corner 112C as illustrated in FIG. 1E. Rather, in some embodiments, the isolation region 112 is formed along with the forming of the isolation region 106 or 206 during a single formation operation, e.g., an etching operation to generate a trench with angled corners, followed by filling the trench by dielectric materials. As a result, the electric field caused by the HV transistor may have peaks around the angled corner of the isolation region 112, and the performance of the HV transistor may be adversely affected. In contrast, the rounded corner 112C of the isolation region 112 proposed herein can effectively eliminate the angles on the sidewall 112S or the bottom surface 112B to thereby reduce the likelihood of electric field peaks around the corner 112C.

In some embodiments, through the usage of the patterned mask layer 108, the isolation region 112 has sidewalls substantially perpendicular to the surface of the substrate 102. In some embodiments, the isolation region 106 (or 206) has a sidewall 106S and a bottom surface 106B, where the sidewall 106S forms an included angle A1 with the bottom surface 106B. An extension line of the upper portion of the sidewall 112S and an extension line of the central portion of the bottom surface 112B form an included angle A2. In some embodiments, the included angle A1 is an obtuse angle. In some embodiments, the included angle A2 is substantially a right angle. The included angle A1 is greater than the included angle A2.

Subsequently, several doped regions are formed in the zones 100A and 100B. Referring to FIG. 1G, a well region 116 is formed in the HV zone 100A. The well region 116 may include a dopant of a conductivity type, e.g., P-type, different from the barrier layer 104. The well region 116 may be a doped region formed by an ion implantation operation with an implant dose between about $10^{16}$ atoms/cm$^2$ and about $10^{17}$ atoms/cm$^2$. The well region 116 may be used to form a guard ring to prevent or mitigate leakage current.

Doped regions 212, 222 and 232 are formed in the HV zone 100A, and a doped region 242 is formed in the NHV zone 100B, as shown in FIG. 1H. The doped regions 212, 222, 232 and 242 may include dopants of a conductivity type, e.g., N-type, the same as the barrier layer 104. The doped regions 212, 222, 232 and 242 may be formed as well regions by an ion implantation operation with an implant dose between about $10^{16}$ atoms/cm$^2$ and about $10^{17}$ atoms/cm$^2$. In some embodiments, the doped regions 212, 222, 232 and 242 are formed by separate implantation operations or the same implantation operation.

Through the formation of the doped regions 212, 222 and 232, doped regions 252 and 262 are defined accordingly. The doped regions 252 and 262 may also referred to as well regions, and have a conductivity type the same as the substrate 102 or the well region 116. In some embodiments, the doped regions 212, 222, 232, 242, 252, 262 or the well region 116 are defined by the isolation regions 106 or 206. In some embodiments, the doped region 222 includes a channel region, which allows carriers to drift between the source/drain regions of the HV transistor 100T along with sidewall 112S and the bottom surface 112B of the isolation region 112 upon appropriate bias voltages on the gate electrode and source/drain terminals of the HV transistor 100T. The doped region 222 laterally surrounds the isolation region 112, and therefore the channel region forms a U-shape around the sidewalls 112S and the bottom surface 112B in the doped region 222.

Referring to FIG. 1I, doped regions 214 and 224 are formed in the doped regions 252 and 262, respectively. The doped regions 214 and 224 may include dopants of a conductivity type, e.g., P-type, the same as the corresponding doped regions 252 and 262. In some embodiments, the doped regions 214 and 224 include dopant concentrations greater than their corresponding doped regions 252 and 262. The doped regions 214 and 224 may be formed by an ion implantation operation with an implant dose between about $10^{17}$ atoms/cm$^2$ and about $10^{19}$ atoms/cm$^2$. In some embodiments, the doped regions 214 and 224 are formed by separate implantation operations or the same implantation operation.

Referring to FIG. 1J, doped regions 216, 226 and 236 are formed in the HV zone 100A. The doped regions 216, 226, 236 may include dopants of a conductivity type, e.g., N-type, the same as the barrier layer 104 or the doped regions 212, 222, 232, 242. In some embodiments, the doped regions 216, 226, 236 include dopant concentrations greater than their corresponding doped regions 212, 222, 232. The doped regions 216, 226, 236 may be formed by an ion implantation operation with an implant dose between about $10^{18}$ atoms/cm$^2$ and about $5\times10^{19}$ atoms/cm$^2$. In some embodiments, the doped regions 216, 226, 236 are formed by separate implantation operations or the same implantation operation.

FIG. 1K illustrates the formation of sacrificial gate structures 121 and 131 for the HV transistor 100T and the NHV transistor 100N in in the HV zone 100A and the NHV region 100B, respectively. In some embodiments, the sacrificial layer 108 is removed. The sacrificial layer is removed by an etching operation, e.g., a dry etch, a wet etch, an RIE, a combination thereof, or the like. The surface of the substrate 102 is exposed accordingly.

The sacrificial gate structure 121 or 131 may include a gate dielectric layer 118 or 128 deposited in the HV zone 100A and the NHV region 100B, respectively. In some embodiments, the gate dielectric layers 118 and 218 are formed of dielectric materials, e.g., nitride, oxide, oxynitride, or the like. In an embodiment, the gate dielectric layers 118 and 128 include a high-k material, such as HfO$_2$, ZrO$_2$, La$_2$O$_3$, Y$_2$O$_3$, Al$_2$O$_3$, TiO$_2$, HfSi$_x$O$_y$, ZrSi$_x$O$_y$, LaSi$_x$O$_y$, YSi$_x$O$_y$, AlSi$_x$O$_y$, TiSi$_x$O$_y$ or the like. The gate dielectric layers 118 and 128 may include the same or different materials.

In some embodiments, the sacrificial gate structure 131 or 133 also includes a sacrificial gate layer 103 or 113 over the gate dielectric layer 118 or 128, respectively. The sacrificial gate layer 103 or 113 may include a gate electrode formed of a conductive material, e.g., polysilicon. In some embodiments, the sacrificial gate layer 103 or 113 includes a multilayer structure, e.g., a hard mask is formed over the gat electrode. The sacrificial gate layer 103 or 113 may be formed by photolithography and etching operations. The etching operation may include a dry etch, a wet etch, an RIE, or a combination thereof. The sacrificial gate layer 103 in the HV zone 100A may be disposed over the isolation region 112. The sacrificial gate layer 103 may partially cover or overlap the isolation region 112 and partially cover or overlap the doped region 214. In some embodiments, the sacrificial gate layer 103 extends from a location above the doped region 252 to a location above the isolation region 112 through the doped region 222. In some embodiments, the sacrificial gate layer 103 is formed between two adjacent isolation regions 206 in the NHV region 100B.

Referring to FIG. 1K, gate spacers 122 or 132 are formed on sidewalls of the respective sacrificial gate structure 131 or 133. In an embodiment, the gate spacers 122 or 132 are formed of a dielectric material such as oxide, oxynitride, nitride, nitrogen-bearing oxide, nitrogen-doped oxide, silicon oxynitride or high-k materials. The gate spacers 122 or 132 may include a multilayer structure. The gate spacers 122 or 132 may be formed by depositing a blanket dielectric material covering the sacrificial gate layer 103 and 113 and the surface of the substrate 102, followed by an anisotropic etching operation to remove the horizontal portions of the dielectric material.

Referring to FIG. 1L, two doped regions 246 are formed in the NHV zone 100B. The doped regions 246 may include dopants of a conductivity type, e.g., N-type or P-type. In some embodiments, the doped regions 246 include dopant concentrations greater than the corresponding doped region 242. The doped regions 246 may be formed by an ion implantation operation with an implant dose between about $10^{18}$ atoms/cm$^2$ and about $5\times10^{19}$ atoms/cm$^2$. In some embodiments, the doped region 246 are formed by an implantation operations using the sacrificial gate structure 131 and the gate spacers 132 as an implant mask.

Referring to FIG. 1M, doped regions 218, 228, 238, 248 are formed in the respective doped regions 212, 226, 236 and 246 with the same conductivity type, e.g., N-type. Similarly, doped regions 268 and 278 are formed in the respective doped regions 224 and 214 with the same conductivity type, e.g., P-type. In addition, a doped region 258 is formed in the doped region 214 adjacent to the doped region 278, in which the doped region 258 has a conductivity type different from that of the doped region 278. The doped regions 218, 228, 238, 248, 258, 268 and 278 may be formed to reduce contact resistance of the corresponding doped regions. In some embodiments, the doped regions 218, 228, 238, 248, 268 and 278 include dopant concentrations greater than their corresponding doped regions 216, 226, 236, 246, 224 and 214. The doped regions 218, 228, 238, 248, 258, 268 and 278 may be formed by an ion implantation operation with an implant dose between about $10^{19}$ atoms/cm$^2$ and about $5\times10^{20}$ atoms/cm$^2$.

In some embodiments, a butted contact 288 is formed over the doped regions 258 and 278. In some embodiments, the butted contact 288 electrically connect the doped regions 258 and 278. The butted contact 288 and include conductive materials, such as titanium, tungsten, copper, aluminum, alloys thereof, or the like.

Referring to FIG. 1N, an interlayer dielectric (ILD) layer 160 is formed over the substrate 102. The ILD layer 160 may be formed with a variety of dielectric materials and may be, for example, oxide, oxynitride, silicon nitride, nitrogen-bearing oxide, nitrogen-doped oxide, silicon oxynitride, polymer, or the like. The ILD layer 160 may formed by any suitable method, such as CVD, PVD, spin coating, or the like. In some embodiments, a planarization operation, e.g., CMP, is adopted to remove excess dielectric materials over the upper surface of the ILD layer 160 and level the surface of the sacrificial gate structures 121, 131 with the upper surface of the ILD layer. The sacrificial gate structures 121, 131 or the gate spacers 122, 132 are exposed through ILD layer 160 after the CMP operation.

Referring to FIG. 1O, the sacrificial gate structures 121, 131 are removed and replaced by replacement gate structures 123, 133, respectively. The sacrificial gate layers 103, 113 are removed and replaced by gate electrodes 125, 135, respectively. In some embodiments, each of the gate electrodes 125 and 135 includes a capping layer, a glue layer, a barrier layer, one or more work function adjustment layer, and a filling layer, the combinations thereof, or the like. Each of the aforesaid component layers of the replacement gate structures 123, 133 may be formed by CVD, PVD, ALD, sputtering, or other suitable deposition methods.

In some embodiments, the gate electrode 125 in the HV zone 100A is disposed over the isolation region 112. The gate electrode 125 partially covers or overlaps the isolation region 112 and partially covers or overlaps the doped region 214. In some embodiments, the gate electrode 125 extends from a location above the doped region 252 to a location above the isolation region 112 through the doped region 222. In some embodiments, the gate electrode 125 is formed between two adjacent isolation regions 106 in the HV region 100A. In some embodiments, the gate electrode 135 is formed between two adjacent isolation regions 106 or doped regions 246 in the NHV region 100B.

In some embodiments, during operation, the doped regions 246 serve as source/drain regions of the NHV transistor 100N while the replacement gate structure 133 serves as the gate terminal of the NHV transistor 100N. In some embodiments, the doped region 242 is used to define an active region of a NHV transistor 100N in the NHV zone 100B.

In some embodiments, during operation, the doped regions 214 and 226 serve as source/drain regions of the HV transistor 100T while the replacement gate structure 123 serves as the gate terminal of the HV transistor 100T. In some embodiments, the doped regions 252, 262 and 116 form a first guard ring of a conductivity type opposite to the doped region 222, in which the first guard ring laterally surround the channel region formed in the doped region 222. In some embodiments, the doped regions 212, 232 and the barrier layer 104 form a second guard ring of a conductivity type identical to the doped region 222, in which the second guard ring laterally surround the first guard ring and the doped region 222. The first guard ring and the second guard ring are formed to prevent leakage and ensure proper functioning of the HV transistor 100T.

Referring to FIG. 1P, several conductive vias 266 are formed in the ILD layer 160. One or more conductive vias 266 formed over the HV zone 100A are electrically coupled to the doped regions 218, 228, 238, 268 and 288. One or more conductive vias 266 formed over the NHV zone 100B are electrically coupled to the doped regions 248. The conductive vias 266 may be formed by forming openings through the ILD layer 160 by an etching operation. A conductive material may fill the openings to electrically connect the underlying structures (e.g., doped regions 218, 228, 238, 248, 268 and 288) to overlying structures (not separately shown). The conductive material of the conductive vias 266 may include, but is not limited to, titanium, tantalum, titanium nitride, tantalum nitride, copper, copper alloys, nickel, tin, gold, or combinations thereof.

According to an embodiment, a method includes: forming a barrier layer in a substrate; depositing a patterned mask layer over the substrate, the patterned mask layer comprising an opening over the barrier layer; performing an ion implantation operation on the substrate through the opening to form an implant region in the substrate; performing a thermal operation on the substrate to form a first isolation region, spaced apart from the barrier layer, from the implant region and; and forming a gate electrode over the substrate and partially overlapping the first isolation region.

According to an embodiment, a method includes: etching a trench on a surface of a substrate; filling the trench with a dielectric material to form a first isolation region; depositing a patterned mask layer on the substrate, the patterned mask layer comprising an opening exposing the substrate; implanting oxygen into the substrate through the opening to form an implant region; generating a second isolation region from the implant region; and forming a transistor on the substrate. The transistor includes a channel laterally surrounding the second isolation region.

According to an embodiment, a semiconductor structure includes a first zone and a second zone. The first zone includes a first transistor formed on a substrate, wherein the first transistor includes a first isolation region defining a boundary of the first transistor, wherein the first isolation region has a first depth. The second zone includes: a second transistor formed on the substrate, wherein the second transistor includes a second isolation region and a gate electrode disposed over the substrate and overlapping the second isolation region; and a barrier layer below and spaced apart from the second isolation region. The second isolation region has a second depth greater than the first depth.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a barrier layer in a substrate;
    depositing a patterned mask layer over the substrate, the patterned mask layer comprising an opening over the barrier layer;
    performing an ion implantation operation on the substrate through the opening to form an implant region in the substrate;
    performing a thermal operation on the substrate to form a first isolation region, spaced apart from the barrier layer, from the implant region; and
    forming a gate electrode over the substrate and partially overlapping the first isolation region.

2. The method according to claim 1, further comprising:
    etching a trench on a surface of the substrate; and
    forming a second isolation region in the trench adjacent to the first isolation region.

3. The method according to claim 2, wherein the first isolation region has a first depth, and the second isolation region has a second depth less than the first depth.

4. The method according to claim 2, wherein the first isolation region has a first sidewall and a first bottom surface, and the second isolation region has a second sidewall and a second bottom surface, wherein the first sidewall and the first bottom surface forms a first included angle, and the second sidewall and the second bottom surface forms a second included angle greater than the first included angle.

5. The method according to claim 2, wherein the first isolation region has a first bottom corner, and the second isolation region has a second bottom corner sharper than the first bottom corner.

6. The method according to claim 1, wherein the ion implantation operation comprises a gas including oxygen to form oxide with silicon of the substrate.

7. The method according to claim 6, wherein the gas further includes fluorine.

8. The method according to claim 7, wherein the thermal operation is performed at a temperature between about 1050° C. and about 1100° C.

9. The method according to claim 1, wherein the implant region comprises a first bottom corner having a substantially right angle, wherein the thermal operation converts the first bottom corner into a rounded corner.

10. The method according to claim 1, wherein the ion implantation operation is performed under an implant energy between about 100 KeV and about 350 KeV.

11. A method, comprising:
    etching a trench on a surface of a substrate;
    filling the trench with a dielectric material to form a first isolation region;
    depositing a patterned mask layer on the substrate, the patterned mask layer comprising an opening exposing the substrate;
    implanting oxygen into the substrate through the opening to form an implant region;
    generating a second isolation region from the implant region; and
    forming a transistor on the substrate, wherein the transistor includes a channel laterally surrounding the second isolation region.

12. The method according to claim 11, wherein the oxygen is implanted using an ion implantation operation comprising a gas including oxygen with an implant dose in a range between about $1\times10^{15}$ and about $1\times10^{18}$ atoms/cm$^2$.

13. The method according to claim 11, wherein the first isolation region has a first depth, and the second isolation region has a second depth, wherein a ratio of the second depth to the first depth is between about 1.5 and about 8.0.

14. The method according to claim 12, wherein the gas further includes fluorine with an implant dose in a range between about $1\times10^{15}$ and about $1\times10^{18}$ atoms/cm$^2$.

15. The method according to claim 11, further comprising forming a first doped region surrounding the second isolation region, wherein the channel is within the first doped region.

16. The method according to claim 11, wherein the forming of the transistor comprises forming a second doped region and a third doped region on two sides of the second isolation region.

17. The method according to claim 11, further comprising forming a third isolation region in the substrate, the third isolation region defining a boundary of the transistor and has a depth the same as that of the first isolation region.

18. A method, comprising:
    forming a barrier layer in a substrate;
    depositing a patterned mask layer over the substrate, the patterned mask layer comprising an opening over the barrier layer;
    performing an ion implantation operation on the substrate through the opening to form an implant region in the substrate;
    treating the substrate to expand the implant region downward to be closer to but spaced apart from the barrier layer, and transform the implant region into a first isolation region; and
    forming a gate dielectric layer over the substrate and non-overlapped with the first isolation region from a top-view perspective.

19. The method according to claim 18, wherein the treating of the substrate further transforms substantially sharp corners at a bottom of the implant region into rounded corners at a bottom of the first isolation region.

20. The method according to claim 18, further comprising forming a gate layer over the gate dielectric layer and a gate spacer on a side of the gate layer, wherein the gate spacer vertically overlaps the first isolation region.

* * * * *